(12) United States Patent
Fukui et al.

(10) Patent No.: US 10,396,020 B2
(45) Date of Patent: Aug. 27, 2019

(54) METHOD OF MANUFACTURING BOARD

(71) Applicant: FUJITSU LIMITED, Kawasaki-shi, Kanagawa (JP)

(72) Inventors: Kei Fukui, Iizuna (JP); Youichi Hoshikawa, Suzaka (JP); Hiromitsu Kobayashi, Nagano (JP); Hidehiko Fujisaki, Nagano (JP); Seigo Yamawaki, Nagano (JP); Masateru Koide, Kawasaki (JP); Manabu Watanabe, Yokohama (JP); Daisuke Mizutani, Sagamihara (JP); Tomoyuki Akahoshi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/956,829

(22) Filed: Apr. 19, 2018

(65) Prior Publication Data

US 2018/0315687 A1 Nov. 1, 2018

(30) Foreign Application Priority Data

Apr. 26, 2017 (JP) .................................. 2017-087307

(51) Int. Cl.
*H05K 3/46* (2006.01)
*H01L 23/498* (2006.01)
*H01L 49/02* (2006.01)
*H05K 1/16* (2006.01)

(52) U.S. Cl.
CPC ........ *H01L 23/49822* (2013.01); *H01L 28/40* (2013.01); *H05K 1/162* (2013.01); *H05K 3/4676* (2013.01); *H05K 3/4632* (2013.01); *H05K 3/4652* (2013.01)

(58) Field of Classification Search
CPC ........ H01L 23/49822; H01L 23/49844; H05K 1/145; H05K 1/162; H05K 1/186; H05K 3/4644–4652
See application file for complete search history.

(56) References Cited

U.S. PATENT DOCUMENTS

| | | | | |
|---|---|---|---|---|
| 6,998,308 | B2 * | 2/2006 | Ooi | H01L 21/6835 257/E21.503 |
| 2006/0044734 | A1 * | 3/2006 | Ahn | H01G 4/1209 361/313 |
| 2006/0215380 | A1 * | 9/2006 | Lu | H01G 4/232 361/763 |
| 2007/0076348 | A1 * | 4/2007 | Shioga | H01G 4/232 361/307 |
| 2007/0108552 | A1 * | 5/2007 | Wan | H05K 1/162 257/532 |
| 2007/0121273 | A1 * | 5/2007 | Yamamoto | H01G 4/232 361/306.2 |

(Continued)

FOREIGN PATENT DOCUMENTS

| JP | 2009-224786 | 10/2009 |
|---|---|---|
| JP | 2010-056126 | 3/2010 |

*Primary Examiner* — Hoa C Nguyen
(74) *Attorney, Agent, or Firm* — Fujitsu Patent Center

(57) ABSTRACT

A board includes a plate-shaped member having a first wiring pattern, a first resin layer formed on a first surface of the plate-shaped member, the first surface having the first wiring pattern, a second resin layer stacked on the first resin layer, and a component fixed to the second resin layer in which a second wiring pattern formed on a second surface of the component is buried.

6 Claims, 8 Drawing Sheets

(56) References Cited

U.S. PATENT DOCUMENTS

2008/0073110 A1* 3/2008 Shioga .................. H05K 1/162
174/258
2009/0231820 A1 9/2009 Tanaka
2017/0231094 A1* 8/2017 Blackshear .......... H05K 1/0298

* cited by examiner

METHOD OF MANUFACTURING BOARD

CROSS-REFERENCE TO RELATED APPLICATION

This application is based upon and claims the benefit of priority of the prior Japanese Patent Application No. 2017-87307, filed on Apr. 26, 2017, the entire contents of which are incorporated herein by reference.

FIELD

The embodiment discussed herein is related to a board and a method of manufacturing a board.

BACKGROUND

Electronic devices have increasingly been reduced in size. As a technique to reduce the sizes of electronic devices, boards that incorporate electronic components have recently been proposed (see for example Japanese Laid-open Patent Publication Nos. 2010-056126 and 2009-224786).

SUMMARY

According to an aspect of the invention, a board includes a plate-shaped member having a first wiring pattern, a first resin layer formed on a first surface of the plate-shaped member, the first surface having the first wiring pattern, a second resin layer stacked on the first resin layer, and a component fixed to the second resin layer in which a second wiring pattern formed on a second surface of the component is buried.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A board that incorporates a thin film component as exemplified by a thin film capacitor (TFC) having a three-layer structure in which a dielectric is held between metal portions may be formed, for example, by attaching a thin resin to a plate-shaped member having a wiring pattern formed on its surface (hereinafter referred to as a "core"), and burying a component in the resin with heating and pressurization. However, a component to be buried in a resin sometimes moves to an unexpected position due to the softening of the resin.

In view of this, the embodiment aims to provide a technique to suppress movement of a component to be buried in a resin of a board as much as possible.

Hereinafter, an embodiment will be described. The embodiment described below is merely an example and does not limit the technical scope of the present disclosure to the aspects described below.

Figure 1:
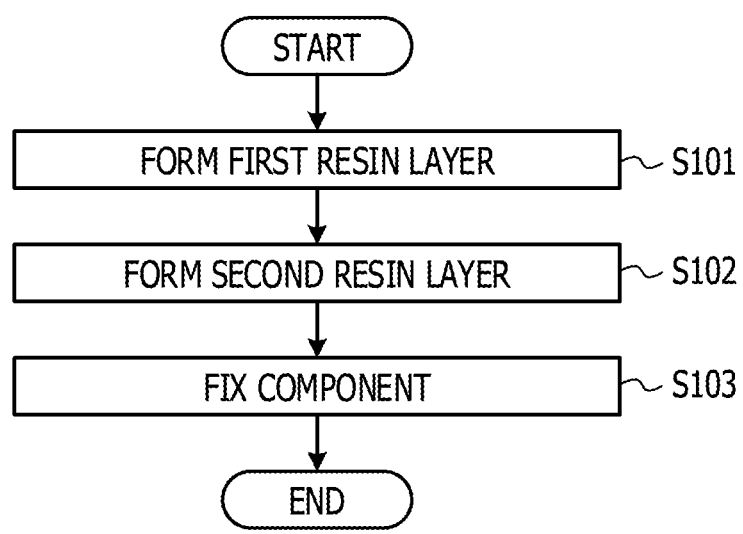
FIG. 1 is an example of a flowchart illustrating steps of a method of manufacturing a board.

FIG. 1 is an example of a flowchart illustrating steps of a method of manufacturing a board. Hereinafter, each step of the method of manufacturing a board according to the embodiment will be described with reference to the flowchart illustrated in FIG. 1.

Figure 2:
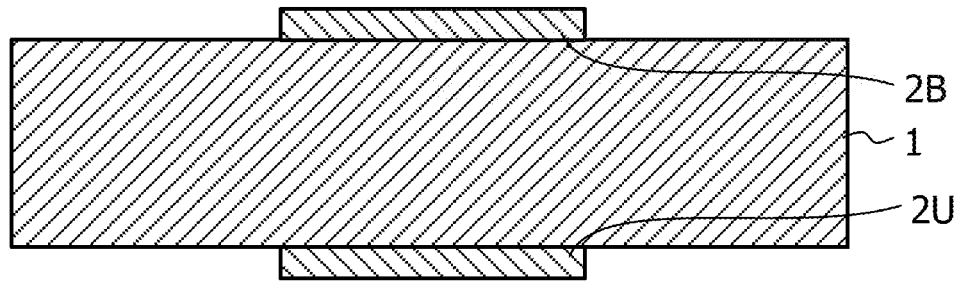
FIG. 2 is a first diagram illustrating a step of manufacturing the board.

FIG. 2 is a first diagram illustrating a step of manufacturing the board. In the present manufacturing method, a core 1 having wiring patterns 2B and 2U formed on both surfaces thereof is prepared. The core 1 constitutes part of the board, which is a product of the present manufacturing method, and is formed for example of an insulating member. The wiring patterns 2B and 2U may be formed for example by patterning copper layers formed on the surfaces of the core 1 through etching.

Figure 3:
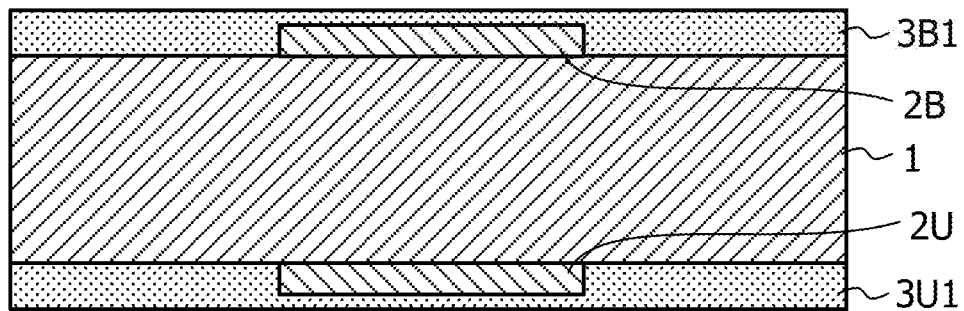
FIG. 3 is a second diagram illustrating a step of manufacturing the board.

FIG. 3 is a second diagram illustrating a step of manufacturing the board. In the present manufacturing method, first resin layers 3B1 and 3U1 are formed on the surfaces of the core 1 on which the wiring patterns 2B and 2U have been formed, in such a manner as to bury the wiring patterns 2B and 2U (S101). The first resin layers 3B1 and 3U1 are formed by curing film-shaped resin attached in an uncured state to both surfaces of the core 1. The film-shaped resin to be attached to both surfaces of the core 1 is selected in accordance with the remaining copper ratio of the wiring patterns 2B and 2U (which is a ratio of the area of a wiring pattern portion occupying the surface on which the wiring pattern has been formed). The film-shaped resin attached in an uncured state to both surfaces of the core 1 is then flattened before being cured. Accordingly, although the first resin layers 3B1 and 3U1 are formed by curing the film-shaped resin attached to the surfaces of the core 1 on which the wiring patterns 2B and 2U have been formed, the first resin layers 3B1 and 3U1 have flat surfaces as illustrated in FIG. 3.

Figure 4:
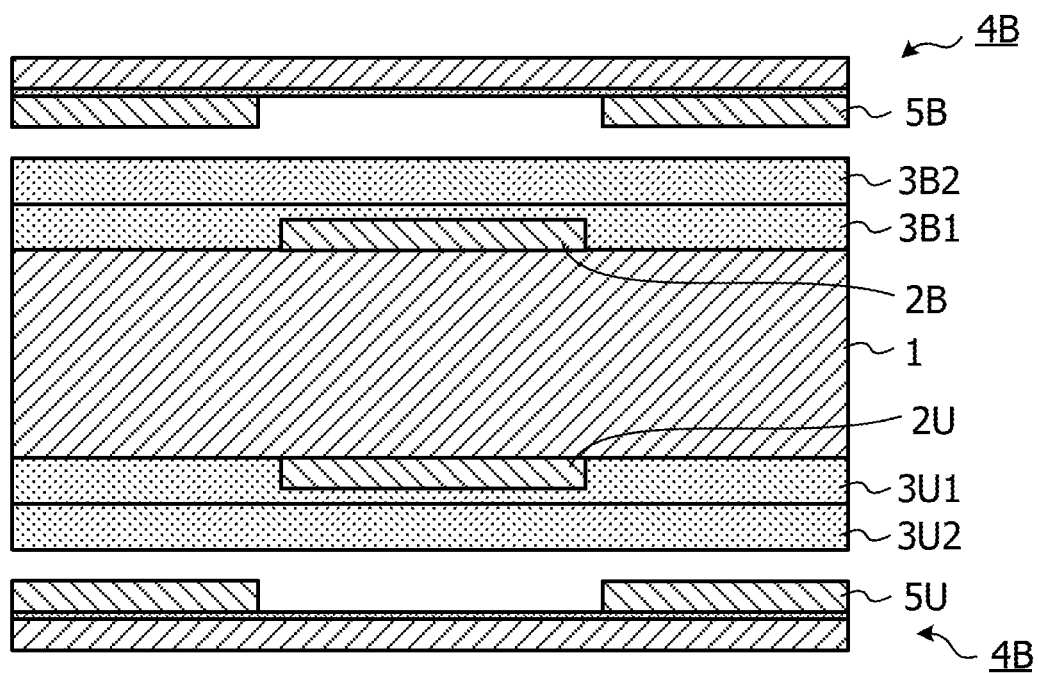
FIG. 4 is a third diagram illustrating a step of manufacturing the board.

FIG. 4 is a third diagram illustrating a step of manufacturing the board. In the present manufacturing method, second resin layers 3B2 and 3U2 are stacked on the first resin layers 3B1 and 3U1 (S102). The second resin layers 3B2 and 3U2 are uncured film-shaped resin attached to the surfaces of the first resin layers 3B1 and 3U1. The film-shaped resin to be attached to the surfaces of the first resin layers 3B1 and 3U1 is selected in accordance with the remaining copper ratio of the wiring patterns 5B and 5U formed on the surfaces of components 4B and 4U which are fixed to at least the second resin layers 3B2 and 3U2.

Figure 5:
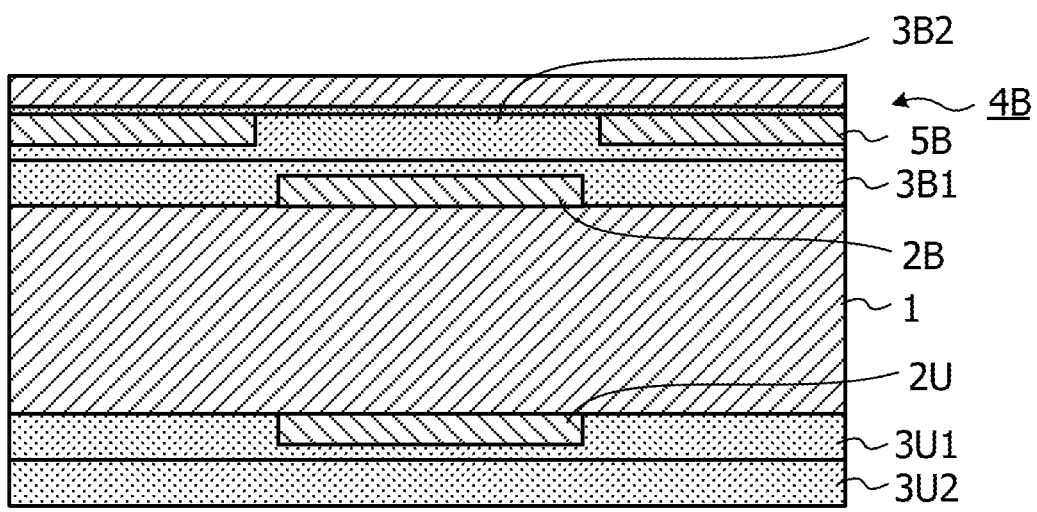
FIG. 5 is a fourth diagram illustrating a step of manufacturing the board.

FIG. 5 is a fourth diagram illustrating a step of manufacturing the board. In the present manufacturing method, the component 4B is fixed to the second resin layer 3B2 in a state where the wiring pattern 5B is buried in the second resin layer 3B2 (S103). Specifically, in the present manufacturing method, the component 4B is attached to the second resin layer 3B2 in a state where the wiring pattern 5B is buried in the second resin layer 3B2 before curing, and thereafter the second resin layer 3B2 is cured.

Figure 6:
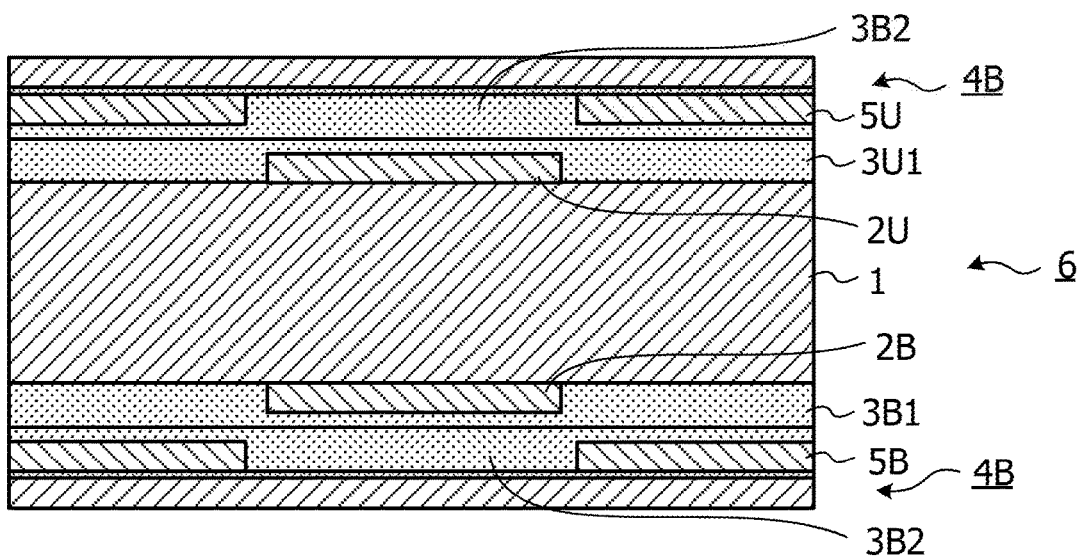
FIG. 6 is a fifth diagram illustrating a step of manufacturing the board.

FIG. 6 is a fifth diagram illustrating a step of manufacturing the board. In the present manufacturing method, the component 4U is fixed to the second resin layer 3U2 in a state where the wiring pattern 5U is buried in the second resin layer 3U2 as in the case of the component 4B (S103). Specifically, in the present manufacturing method, the component 4U is attached to the second resin layer 3U2 in a state where the wiring pattern 5U is buried in the second resin layer 3U2 before curing, and thereafter the second resin layer 3U2 is cured. Fixing the component 4B and the component 4U to the surfaces not simultaneously but separately one after the other makes uniform the direction in which pressure is applied when the components 4B and 4U are pressed, and accordingly makes it possible to reduce the amounts of movement of the components 4B and 4U.

By taking the above-described series of manufacturing steps, a board 6 having the components 4U and 4B is formed. Note that although in the present embodiment, the component 4B is first fixed to the second resin layer 3B2 and then the component 4U is fixed to the second resin layer 3U2, the order of fixation may be reversed. In addition, the board 6 may have only one of the component 4U and the component 4B.

Figure 7:
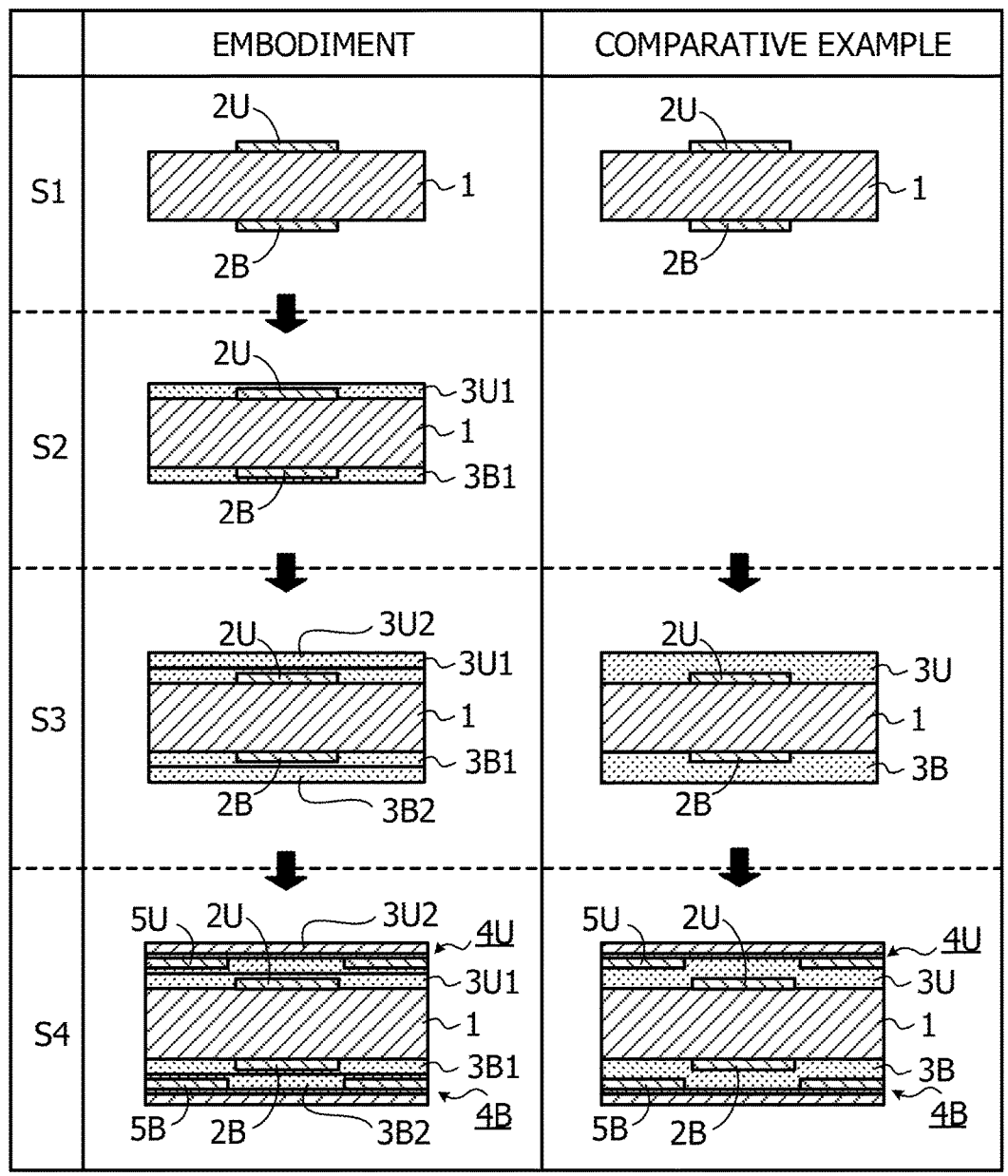
FIG. 7 is a diagram comparing manufacturing steps.

FIG. 7 is a diagram comparing manufacturing steps. In the manufacturing method of the above-described embodiment, the first resin layers 3B1 and 3U1 are formed on the core 1 having the wiring patterns 2B and 2U formed on both surfaces (S1, S2). Then, the second resin layers 3B2 and 3U2 are further stacked on the first resin layers 3B1 and 3U1 (S3). Then, the components 4B and 4U are fixed to the second resin layers 3B2 and 3U2 (S4).

On the other hand, in a manufacturing method of Comparative Example, resin layers 3B and 3U are formed on a core 1 having wiring patterns 2B and 2U formed on both surfaces (S1, S3). Then, a component 4B is attached to the resin layer 3B in a state where a wiring pattern 5B is buried in the resin layer 3B in an uncured state, and then the resin layer 3B is cured, and a component 4U is attached to the resin layer 3U in a state where a wiring pattern 5U is buried in the resin layer 3U in an uncured state, and then the resin layer 3U is cured (S4). In other words, in the manufacturing method of Comparative Example, a portion formed by two resin layers, that is, the first resin layer 3B1 and the second resin layer 3B2 of the embodiment is formed solely by the resin layer 3B, and a portion formed by two resin layers, that is, the first resin layer 3U1 and the second resin layer 3U2 of the embodiment is formed solely by the resin layer 3U.

As seen from the comparison between the embodiment and Comparative Example illustrated in FIG. 7, in the embodiment, resin of an portion that is uncured when the components 4U and 4B are attached is the second resin layer 3U2 and the second resin layer 3B2, while in Comparative Example, resin of a portion that is uncured when the components 4U and 4B are attached is the resin layer 3U and the resin layer 3B. That is, the thickness of the resin of the portion uncured when the components 4U and 4B are attached is smaller in the embodiment than in Comparative Example.

The displacement of the components 4U and 4B occurs because the softening of molten resin and application of weight to the components 4U and 4B interact with each other during pressurization of the uncured resin under vacuum. The larger the thickness of uncured resin is, the more significant the displacement of the components 4U and 4B is. Moreover, the directions of movement of the components 4U and 4B to be pressurized against the softened resin are also not uniform. The displacement of the components 4U and 4B increases the possibility of causing the following troubles. Specifically, in a case where the displacement of the components 4U and 4B has occurred, when a through-hole is formed in the board 6, for example, the components 4U and 4B come into contact with the through-hole, bringing about short-circuit between the wiring layers on which the components 4U and 4B have been formed and another wiring layer, and decrease in reliability. In this regard, the thickness of the resin of the portion uncured when the components 4U and 4B are attached is smaller in the embodiment than in Comparative Example. Thus, the possibility that the components 4U and 4B attached to uncured resin move to unexpected positions due to the softening of the resin is lower in the embodiment than in Comparative Example.

In addition, to suppress the displacement of the components 4U and 4B, one may consider to reduce the pressurization to the components 4U and 4B or reduce the heating to the components 4U and 4B when the components 4U and 4B are fixed to the resin layers 3U and 3B in Comparative Example, for example. In such case, however, the possibility that the gap in the wiring patterns 2U and 2B or in the wiring patterns 5U and 5B be not completely filed with resin and a void be generated increases. If the gap in the wiring patterns 2U and 2B or in the wiring patterns 5U and 5B is not completely filed with resin and a void is generated, short circuit between wires or reduction in reliability occurs when Cu plating is deposited in the void. In this regard, since in the above-described embodiment, the resin of the portion where the components 4B and 4U are to be fixed is formed by attaching the sheet-shaped resin in two steps separately, the pressurization or the heating to the components 4U and 4B does not have to be reduced in order to suppress the displacement of the components 4U and 4B.

Figure 8:
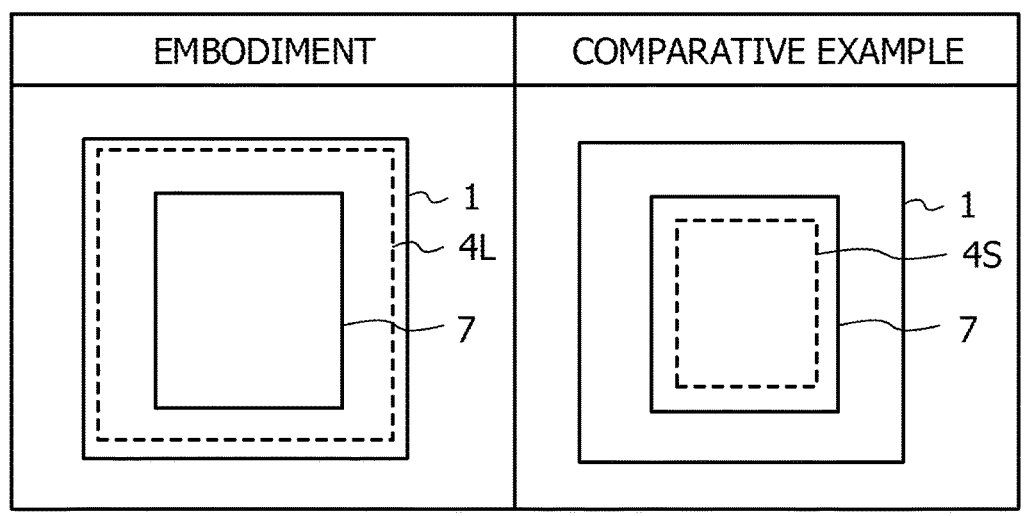
FIG. 8 is a diagram illustrating an example of a positional relationship among a core, a component, and an underfill area.

FIG. 8 is a diagram illustrating an example of a positional relationship among the core 1, the component, and an underfill area. Suppose that an underfill area 7 is formed in the board after the manufacturing method of the above-described embodiment or Comparative Example. For example, a component 4S, which is smaller than the underfill area 7 formed to cover part of the board, is likely to move by an amount larger than that of a relatively large component 4L when placed on softened resin, and accordingly the quality of the component 4S is unstable. Moreover, when the component is a capacitor for example, there is a possibility that a satisfactory electrostatic capacitance is not secured with the small component 4S. However, in a case where the component is fixed to resin by the method of Comparative Example, if the component to be fixed to the resin is large, there is a possibility that a portion not fully filled with the resin is generated in the gap in the wiring patterns 2U and 2B or in the wiring patterns 5U and 5B. In this regard, in the above-described embodiment, the resin of the portion where the components 4B and 4U are to be fixed is formed by attaching the sheet-shaped resin in two steps separately, the possibility that a portion not fully filled with the resin is generated in the gap in the wiring patterns 2U and 2B or in the wiring patterns 5U and 5B is low. According to the method of the embodiment, it therefore is possible to apply a capacitor having a large capacity as the components 4B and 4U, for example.

The advantageous effects of the embodiment were examined, and the result is given below. In this examination, in a test product corresponding to the above-described embodiment, the first resin layers 3B1 and 3U1 as well as the second resin layers 3B2 and 3U2 were formed using sheet-shaped uncured resin having a thickness of 25 μm, while in a test product corresponding to Comparative Example, the resin layers 3B and 3U were formed using sheet-shaped uncured resin having a thickness of 50 µm. As a result of the examination, in Comparative Example, the components 4B and 4U moved by up to approximately 100 µm while in the embodiment, the amount of movement was approximately 30 µm at most (including the amount added by shrinkage of the resin due to curing). When this is converted to the generation rate of defective products due to the displacement of the components 4B and 4U, the generation rate of Comparative Example is 80 to 90% while the generation rate of the embodiment is within 10%.

Note that in this examination, since the thickness of the sheet-shaped resin used in the test product corresponding to Comparative Example was 50 µm, the second resin layers 3B2 and 3U2 were each formed using sheet-shaped resin having a thickness of 25 µm. However, since in the above-described embodiment, the resin of the portion where the components 4B and 4U are to be fixed is formed by attaching sheet-shaped resin in two steps separately, thin resin (for example, resin having a thickness of approximately 10 to 20 µm) depending on the remaining copper ratio of the wiring patterns 5B and 5U may be used for the second resin layers 3B2 and 3U2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of manufacturing a board, comprising:
   forming a first resin layer on a first surface of a plate-shaped member having a first wiring pattern, the first surface having the first wiring pattern;
   forming a third resin layer on a second surface of a plate-shaped member having a second wiring pattern and opposite to the first surface, the second surface having the second wiring pattern;
   stacking a second resin layer on the first resin layer;
   stacking a fourth resin layer on the second resin layer;
   fixing a first component to the second resin layer in which a third wiring pattern formed on a third surface of the first component is buried by pressing the first component to the second resin layer; and
   fixing a second component to the fourth resin layer in which a fourth wiring pattern formed on a fourth surface of the second component is buried by pressing the second component to the fourth resin layer,
   the second resin layer is selected based on a remaining copper rate indicating a ratio of an area of the third wiring pattern to an area of a surface on which the third wiring pattern is formed,
   the fourth resin layer is selected based on a remaining copper rate indicating a ratio of an area of the fourth wiring pattern to an area of a surface on which the fourth wiring pattern is formed,
   the first resin layer is selected based on a remaining copper rate indicating a ratio of an area of the first wiring pattern to an area of a surface on which the first wiring pattern is formed, and
   the third resin layer is selected based on a remaining copper rate indicating a ratio of an area of the second wiring pattern to an area of a surface on which the second wiring pattern is formed.

2. The method of manufacturing a board according to claim 1, wherein in the stacking a second resin layer, the second resin layer in an uncured state is stacked on the first resin layer that has been cured, in the fixing the first component, the first component is first attached to the second resin layer in the uncured state, and then the second resin layer is cured to fix the first component.

3. The method of manufacturing a board according to claim 1, wherein the first component is larger than an underfill area provided in the board.

4. The method of manufacturing a board according to claim 1, wherein the fixing the first component and the fixing the second component are performed at different times.

5. The method of manufacturing a board according to claim 1, wherein thicknesses of the second resin layer and the fourth resin layer are determined based on the remaining copper rate of the third wiring pattern and the fourth wiring patter, respectively.

6. The method of manufacturing a board according to claim 5, wherein each of the thicknesses of the second resin layer and the fourth resin layer is 10 to 20 µm.

* * * * *